United States Patent [19]

Ho et al.

[11] Patent Number: 4,984,079
[45] Date of Patent: Jan. 8, 1991

[54] VIDEO PREAMPLIFIER CIRCUIT

[75] Inventors: Keese Ho, Westminster; Bruce R. Ferguson, Tustin; Gregory J. Sandoval, San Diego, all of Calif.

[73] Assignee: Hughes Aircraft Company, Los Angeles, Calif.

[21] Appl. No.: 386,384

[22] Filed: Jul. 26, 1989

[51] Int. Cl.⁵ .............................................. H04N 5/14
[52] U.S. Cl. ..................................... 358/160; 358/184; 358/186; 333/16; 333/18
[58] Field of Search .................. 358/184, 86, 187, 160, 358/176, 149; 333/28 R, 16; 330/304, 302, 303

[56] References Cited

U.S. PATENT DOCUMENTS

| | | | |
|---|---|---|---|
| 4,032,974 | 6/1977 | Roessel | 358/160 |
| 4,148,069 | 4/1979 | Smiley | 358/160 |
| 4,214,261 | 7/1980 | Bazin et al. | 358/149 |
| 4,220,931 | 9/1980 | Hines et al. | 358/176 |
| 4,404,551 | 9/1983 | Howse | 340/711 |
| 4,588,956 | 5/1986 | de Carlieu | 330/302 |
| 4,746,881 | 5/1988 | Suzuki | 333/18 |

Primary Examiner—Howard W. Britton
Assistant Examiner—Michael H. Lee
Attorney, Agent, or Firm—Wanda K. Denson-Low

[57] ABSTRACT

A high speed, variable gain video preamplifier circuit disposed on a single IC which can accommodate multiple video input channels supplied by cables of varying length. A multiplexer 34 uses information about the cable length supplied to input pads to selectively connect the outputs of several series connected compensating amplifiers 42(a-b), 44 and 46 to the variable gain amplifier 36. The preamplifier circuit is characterized by a comparative wide common mode input range, as well as being capable of accepting two input channels and providing efficient cable compensation.

12 Claims, 6 Drawing Sheets

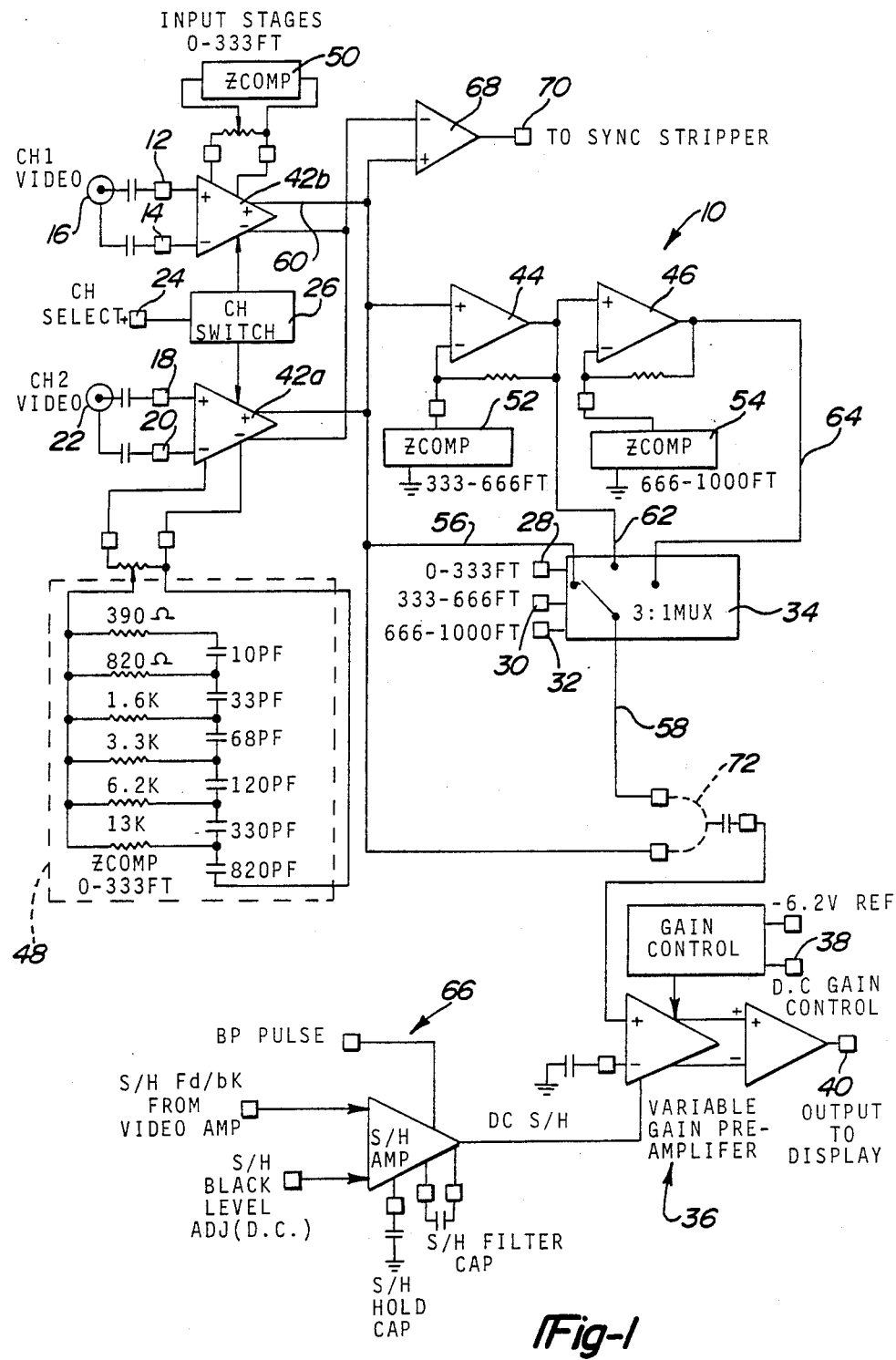

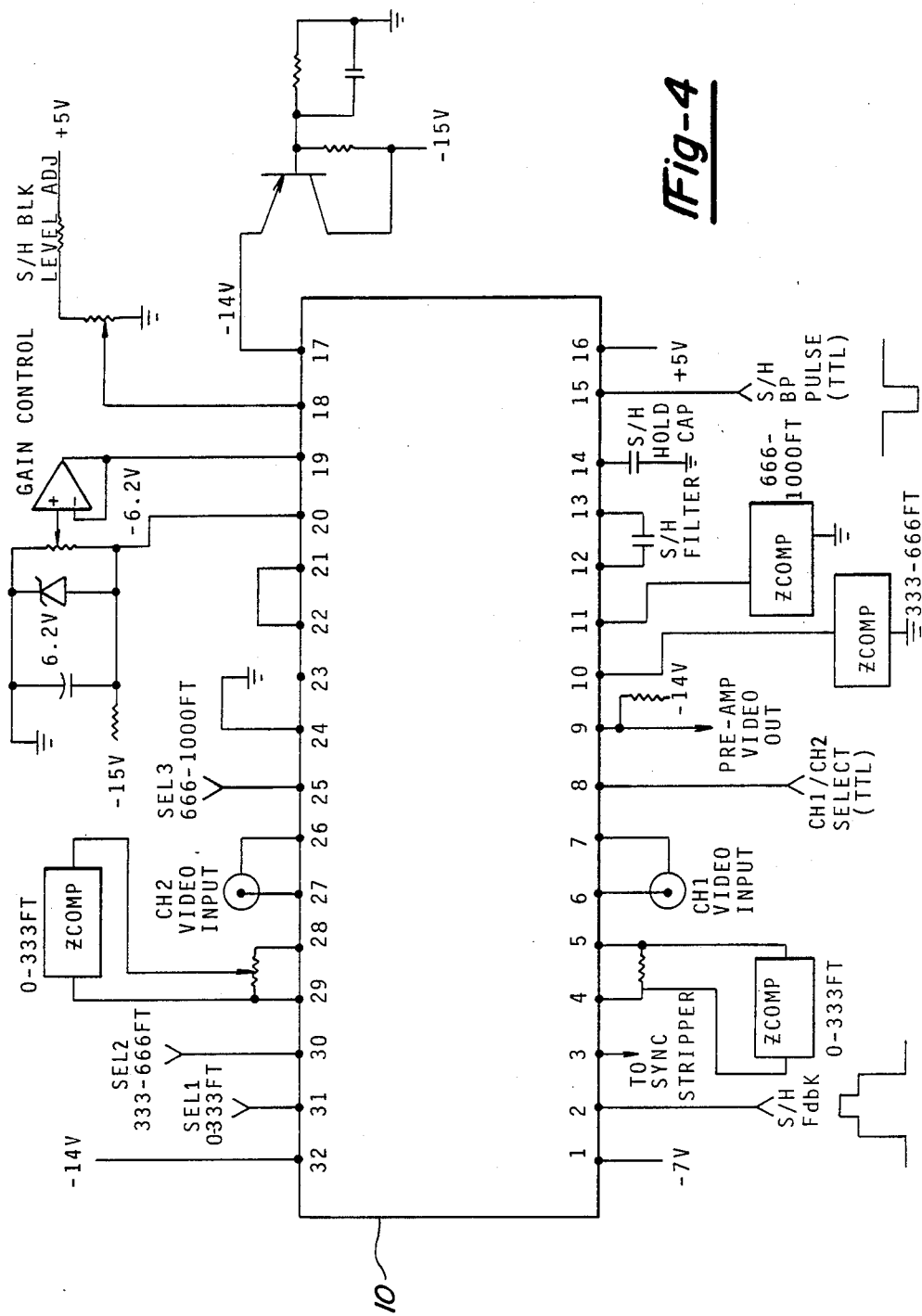

VIDEO PREAMPLIFIER CIRCUIT

BACKGROUND OF THE INVENTION

1. Technical Field

This invention relates to amplifier circuits and, more particularly, to video preamplifier circuits that can be implemented in integrated circuit form.

2. Discussion

High resolution monochrome or color raster scan video displays are finding use in an increasing number of applications. It is envisioned that the newer video displays will employ more raster scan lines (for example, 2,000×2,000 lines) in order to increase resolution. Such displays will require high speed operation of the driver circuitry including preamplifiers to adequately process the increased number of scan lines.

High speed video preamplifiers are known for use with raster display drivers. However, the prior preamplifier circuits have limited common-mode signal rejection input ranges which is mainly due to semiconductor process limitations while having no provision for accepting more than one video input source or for providing any internal cable compensation. The ability to accept multiple video input sources without loss of signal strength increases the flexibility of a preamplifier. In addition, a higher common mode input range increases the effectiveness of filtering out noise. It is well known that when video signals are carried over cables of long lengths the signal can be significantly attenuated. Presently, correction of such attenuation requires complex circuitry necessary to duplicate the mathmatical error function of attenuation.

Currently, discrete components are too slow to address the needs of advanced video displays, while integrated circuits have a limited common-mode input range. Therefore, it would be desirable to provide a high speed preamplifier circuit capable of greater common mode input ranges and providing cable compensation in such a form that the entire circuitry can be readily implemented as a single integrated circuit device, if desired.

It is therefore an object of this invention to provide a high speed video preamplifier circuit that solves one or more of these problems.

SUMMARY OF THE INVENTION

In accordance with the teachings of the present invention, there is provided a high speed, variable gain video preamplifier circuit for amplifying video signals carried by a cable. The preamplifier circuit has an output that can be coupled to a raster scan video display. The preamplifier circuit can be implemented in a single integrated circuit device form that has a plurality of input pads and at least one output pad for connection to the display. Provision is made for providing information to the integrated circuit device related to the length of the cable that carries the video signal. Compensation circuitry is provided for compensating for the attenuation characteristics of that given length of cable. This circuitry is relatively simple, compensating for attenuation, while increasing the speed of circuit operation.

In the preferred embodiment, the preamplifier circuit further includes provision for accepting two different input video channels and means for selecting one of them for further processing at a broad common input range. This circuit increases flexibility of operation while operating at relatively high speed with better processing ability.

BRIEF DESCRIPTION OF THE DRAWINGS

The various advantages of the present invention will become further apparent to those skilled in the art after reading the following description of the preferred embodiment and by reference to the drawings in which:

FIG. 1 is a schematic block diagram of a preamplifier circuit made in accordance with the teachings of the present invention;

FIG. 4 is a diagram showing various external connections to the integrated circuit packaged as a hybrid.

DESCRIPTION OF THE PREFERRED EMBODIMENT

Figure 2A:
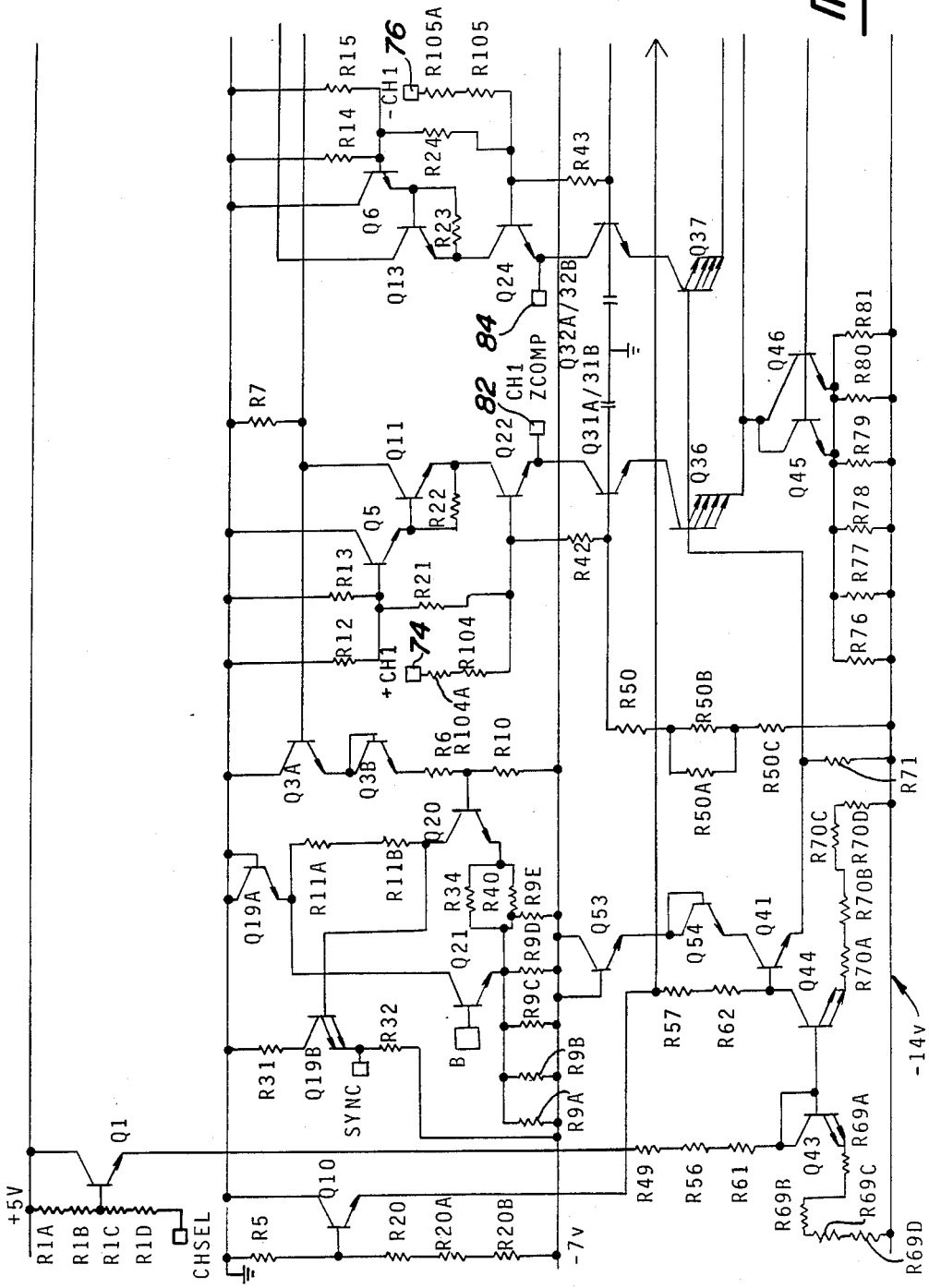
FIG. 2(A-B) is a detailed schematic diagram of circuitry for switching between different video input channels.

Turning now to FIGS. 1 and 4, the present invention has been designed so that it can be implemented in integrated circuit form providing all of the advantages that will become apparent to those skilled in the art after having the benefit of reading the following description and studying the drawings. In FIG. 4, the integrated circuit device 10 is shown packaged in a 32 pin hybrid package having a plurality of input and output terminals or pads. External circuitry provides signals to the internal circuitry on the semiconductor chip contained within the device 10 through the input pads. FIG. 1 shows a block diagram of the internal circuitry on the semiconductor device chip. In FIG. 1, the squares represent input and output pads. Two of the input pads 12 and 14 receive the input video signal which is carried by a first cable 16. It is a feature of this invention that the preamplifier circuitry can accept more than one video input source. For example, pads 18 and 20 are shown as coupled to a channel 2 video input carried by a second cable 22. A channel select pad 24 receives an externally applied signal for selecting between the channel 1 video on cable 16 or the channel 2 video carried on cable 22. The signal on pad 24 operates to cause switching circuitry 26 to select either the channel 1 or channel 2 video input signal for further processing by the preamplifier circuitry.

The video signal is typically derived from a variety of sources such as video test pattern generator and carried over various lengths of cables to the preamplifier device 10. Typically, the preamplifier device 10 will be part of a video channel which consists of preamplifier and video amplifier circuitry. The video signal may be carried over cables of very long lengths. It is known that the video signal will be attenuated or degraded when it is carried over long lengths of cable. Cables of longer lengths, of course, will attenuate the signal more than cables of shorter lengths. It is a feature of this invention that the integrated circuit device 10 compensates for this attenuation of the signal and, moreover, it tailors the amount of compensation for different lengths of cables by providing multiple, selectable amounts of compensation. In accordance with one embodiment of the present invention, compensation for cable lengths in three different ranges is provided: namely, a range of 0–333 feet, a range of 333–666 feet and a range of 666–1000 feet. This invention is not limited to only three ranges, more or fewer ranges may be provided depending upon the application. Three separate input pads 28, 30 and 32 are provided to supply information related to the length of the cable being used. In the preferred embodiment, this information takes the form quite simply of a logical high or low signal applied to the appropriate pad. These selection signals control a 3:1 multiplexer 34. Multiplexer 34 is connected between the cable compensation circuitry and a gain controlled variable preamplifier generally designated by the numeral 36. Variable preamplifier 36 serves to amplify the compensated signal as a function of the gain control input on pad 38. The amplified signal is then output over pad 40 to the raster scan display.

The cable compensation network in this embodiment includes, for each video input channels, a common set of three series-connected amplifiers 42(a–b), 44 and 6. Each amplifier has its own external compensating network coupled to it through input pads on the device 10. Z-Compensation (Z-Comp) circuitry 48 is coupled to amplifier 42a. Substantially identical external Z-Comp circuitry 50 is coupled to amplifier 42b. Z-Comp external circuitry 52 is coupled to amplifier 44 whereas external Z-Comp circuitry 54 is coupled to amplifier 46. The external Z-Comp circuitry cooperates with the on-chip amplifier to vary the gain such that in one embodiment, it allows unity gain at DC and a high frequency gain of 6DB. Thus, throughout the DC and high frequency range, the Z-Comp circuitry cooperates with the on-chip amplifier to produce an output gain response complementary to the loss response of a typical 333 foot coaxial cable. The resultant overall response is thus flat in said frequency range.

In the preferred embodiment the circuitry is formed on a single integrated circuit and the amplifiers 42(a–b), 44 and 46 and their external Z-Comp circuitry 48, 50, 52 and 54 are matched or are substantially identical. Thus, they provide substantially identical degrees of compensation. The present invention overcomes previous difficulties in continuously compensating long lengths of coaxial cables by dividing the compensation into segments, in this case three 333 feet segments. If the selected length of cable falls within the 0-333 foot range, an appropriate signal is applied to input pad 28 to cause the multiplexer 34 to couple input line 56 to the output line 58. Assuming, for example, that the channel 1 video has been selected, this means that the output of amplifier 42b on line 60 is coupled to the variable amplifier circuitry 36. Amplifier 42b and its Z-Comp circuitry 50 have compensated for the attenuation of the signal caused by the 0-333 foot long cable. The compensated signal thus is amplified by variable amplifier 36 and then output to the display over pad 40. On the other hand, if the cable is in the 333-666 foot range, the appropriate signal on pad 30 causes multiplexer 34 to select line 62 which is coupled to the output of amplifier 44. In this mode, the output of amplifier 42b is added to the compensation provided by the 333-666 foot compensator amplifier 44 and associated Z-Comp circuitry 52. Finally, multiplexer 34 selects line 64 connected to the output of amplifier 46 if the cable is in the 666-1000 foot range as indicated by the appropriate signal on input pad 32. Under these circumstances, the compensation of amplifier 44 as well as that of amplifier 42b is added to that of amplifier 46 and its external Z-Compensation network 54.

This cable compensation scheme overcomes the difficulty of correcting for attenuation over long cable lengths. Such difficulty was due generally to the amount of circuitry necessary to duplicate the error function of the cable response. In addition, the known approaches generally operated at relatively low speeds whereas the present invention can operate with a band width of in excess of 150 megahertz because of the IC packaging. All of these advantages are provided in a relatively simple manner using approximate compensation for cable attenuation rather than precise, complex compensation.

The integrated circuit device 10 also includes other functions usually found in preamplifier circuits. A sample and hold circuit generally designated by the numeral 66 operates to stabilize the video black level. It does this by sampling the video at the cathode of the CRT being driven during the time necessary for the sample hold circuit to restore the video image to the predetermined DC level, so called back porch time, and forcing it to remain constant.

The gain controlled variable gain amplifier circuitry 36 operates by receiving three signals. First it receives the cable compensated video signal from the 3:1 MUX 34; second, it receives a DC gain control signal from pad 38 (pin 19, FIG. 4) to set the video peak to peak swing on output pad 40 (pin 9, FIG. 4) to an operator desired amplitude; third, it receives a DC S/H signal from the S/H amplifier 66 to stabilize the back porch level of the video signal at output pad 40, corresponding to the video amplifier output DC level (video amplifier not shown).

Further, amplifier 68 provides an output on pad 70 (pin 3, FIG. 4) by taking the input composite video and amplifying said sync signal. The sync output on pad 70 can be used for synchronization stripping.

Finally, an external jumper 72 may be inserted to bypass cable compensation amplifiers 44 and 46 and the multiplexer 34 for maximum bandwidth operation by relying solely on the input amplifiers 42a or 42b.

Figure 2B:
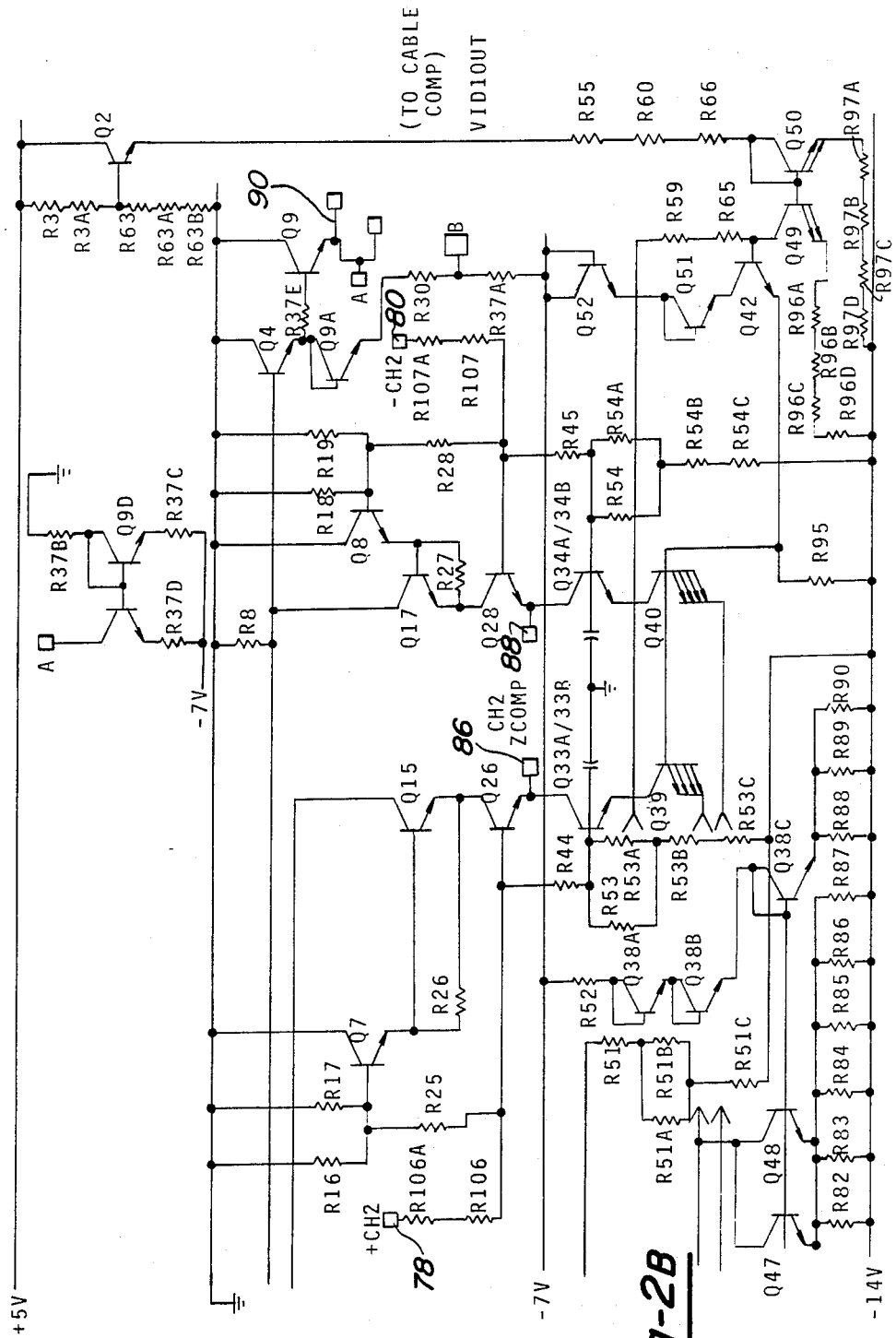

A detailed schematic diagram of the circuitry for switching between the different video input channels is shown in FIG. 2(A–B). These drawings are substantially self-explanatory to those persons skilled in the art and thus, they need not be described in detail to provide those persons with a complete understanding of the present invention. Briefly, the input stage consists of two differential pairs that share a common load R8. The gain is set via an external resistor bridging the two channel 1 and channel 2 Z-Comp input pads 82, 84 and 86, 88, respectively. The common mode signal (7.0 volts peak to peak maximum) is distributed across several transistors which are in a stacked common-base configuration. Common-base stages Q11, Q13 are used to float the differential pair. A Darlington configuration consisting of transistors Q5 and Q11 reduces the impedance of the base of transistor Q11 thereby increasing bandwidth. The channel select function is accomplished by engaging the appropriate pair of current sources (Q36/Q37 or Q39/Q40) via current steering. The open collector TTL channel select input CHSEL sets the DC bias at the base of transistor Q36/Q37 either above (channel 1 selected) or below (channel 2 selected) the constant DC bias on the base of transistor Q39/Q40. As a result, either the video signal provided to the channel 1 or channel 2 input pads 74, 76 or 78, 80 are coupled through load R8 which in turn drives the transistor Q9.

Figure 3A:
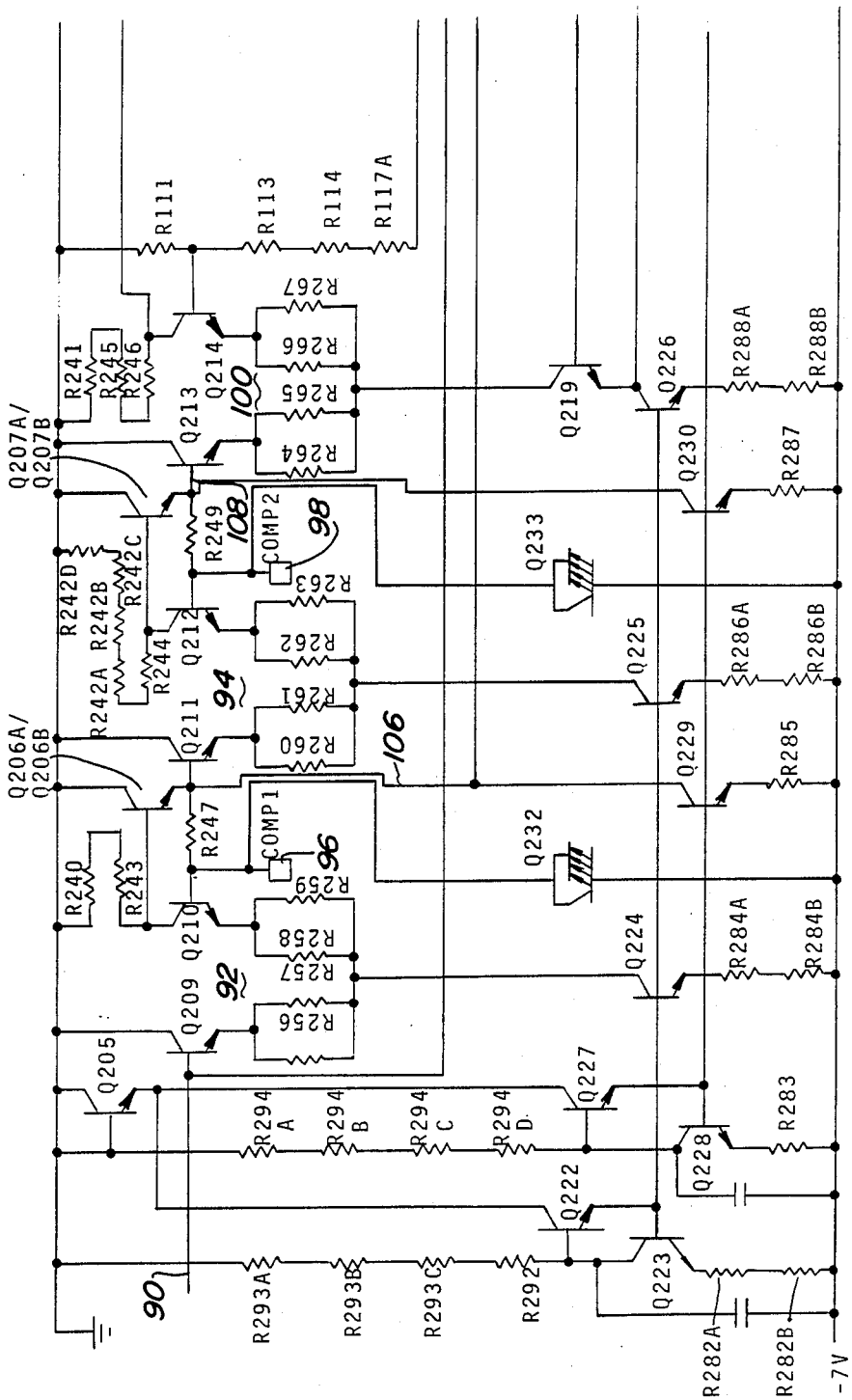
FIG. 3(A-B) is a detailed schematic diagram of a cable compensation and multiplexing circuitry usable in an embodiment of the invention.
Figure 3B:
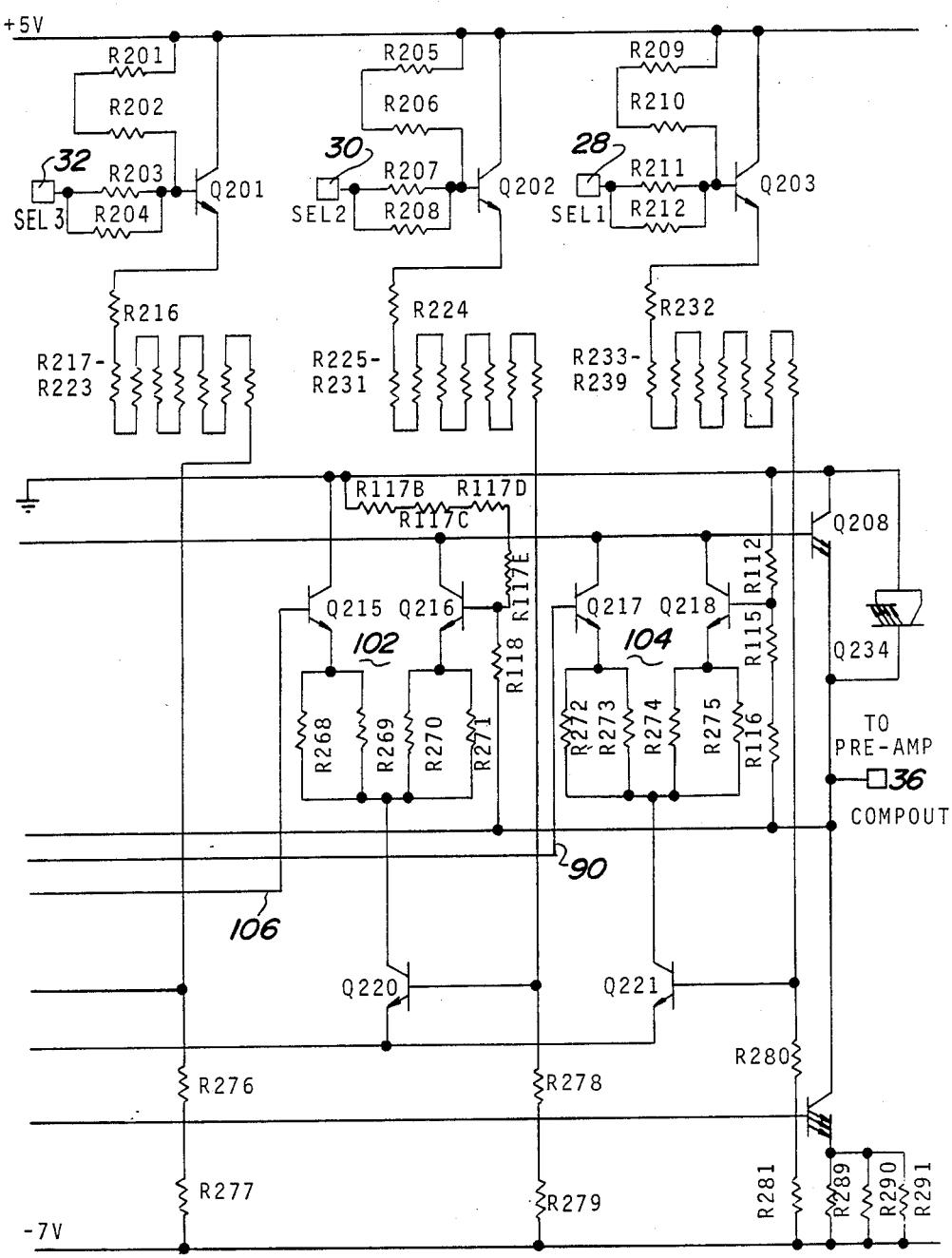

External Z-Comp circuitry 48 and 50 are coupled to input pads 82, 84 and 86, 88 to provide the cable compensation in the 0-333 foot range depending upon whether channel 1 or channel 2 is selected. The output of transistor Q9 is coupled to line 90 in FIG. 3A which shows the details of the compensating amplifiers for the other two ranges, as well as the multiplexer 34. The amplifier 44 for the 333–666 foot range and the amplifier 46 for the 666–1000 foot range are provided by two cascaded feedback amplifier stages generally designated by the numerals 92 and 94. The DC gain of each stage is unity allowing DC coupling. Emitter resistors in the differential pairs (Q209/Q210, Q211/Q212) lower the open loop gain which increase the unity gain phase margin to 70 degrees without degrading the slew rate performance at the output. External Z-Comp network 52 is coupled to pad 96 whereas the Z-Comp circuitry 54 for the 666–1000 foot range is coupled to input pad 98. It will be remembered that the 0–333 foot cable compensation for either the channel 1 or channel 2 video has been accomplished in connection with the amplifiers discussed in FIG. 2. Thus, the signal on line 90 has already been compensated for cables in the 0–333 foot range.

Multiplexer 34 is implemented with three multiplexer amplifiers generally designated by the numerals 100, 102 and 104. These three mux amplifiers share a common output transistor Q208. Three input transistors Q201, Q202 and Q203 receive selection signals from pads 28, 30 and 32, respectively. These transistors with internal pull-ups for open collector TTL operation are used to steer the common current source provided by transistor Q226. External logic ensures that one and only one TTL input on pads 28, 30 and 32 is high at all times. Depending upon which mux amplifier is engaged, cable compensation for the three aforementioned increments are selected. For example, if pad 28 is at a logical high level, and pads 30 and 32 are at a low level, mux amplifier 104 will conduct thereby connecting only the signal on line 90 to the output transistor Q208. Activation of mux amplifier 102 will couple the output of compensation amplifier 92 to the output transistor Q208 over output line 106 whereas engagement of mux amp 100 will couple the output of compensation amplifier 94 on line 108 to the output transistor. Output transistor Q208 is, in turn, coupled to the preamplifier circuitry 36 via an external capacitor. As discussed, the preamplifier circuitry 36 amplifies the compensated signal and supplies it over output pad 40 (pin 9, FIG. 4) to the driver of the raster scan display.

In view of the foregoing, those skilled in the art can appreciate that the present invention provides significant advantages over the prior art. It can process video signals driven over long lengths of cables at a video bandwidth of at least 150 megahertz using a segmented video cable compensation scheme. Two video channels can be selected with 7.0 volts peak to peak of common mode signal rejection on each channel. A floating bias scheme is used to thereby circumvent semiconductor process limitations which are often limited to 5.5 volts peak to peak. All of the channel and cable compensation switching is TTL compatible for simple automatic/computer interface. The integrated circuit can be used to drive monochrome/color displays with or without cable compensation. The three segmented cable compensation scheme, however, reduces a previously complex compensation problem in building complex circuitry to duplicate the cable response error function to a simple one of approximating a response thereby saving chip space for the rest of the integrated circuit system.

We claim:

1. A high speed, variable gain video preamplifier circuit for amplifying video signals carried by a cable of a given length, the preamplifier circuit having an output for coupling the preamplified signals to a raster scan video display, said preamplifier circuit comprising:
    an integrated circuit device including:
    at least one output pad for connection to the video display;
    selection means having at least one input pad for receiving information relating to the length of the cable;
    cable compensation means for selectively providing increased gain to the received video signal to compensate for the attenuation of the video signal due to the length of cable, said compensation means including at least one amplifier and a compensation circuit for providing a predetermined gain to the at least one amplifier; and
    variable gain amplifier means coupled between the cable compensation means and said output pad for amplifying the compensated signal from the cable compensation means.

2. The circuit of claim 1 wherein said cable compensation means comprises:
    a plurality of amplifier networks having a given gain, and wherein said selection means connects selected amplifier networks together as a function of the length of the cable.

3. The circuit of claim 2 wherein the amplifier networks are connectable in series such that the video signal if amplified by a given amount in each network.

4. The circuit of claim 3 which further comprises:
    multiplexer means for selectively connecting an output of one amplifier network to the variable gain amplifier means.

5. The circuit of claim 1 wherein:
    said cable compensation means includes a first amplifier for amplifying video signals which have been attenuated by cable lengths of 0–333 feet; a second amplifier series connected to said first amplifier and cooperating therewith to compensate for signals which have been attenuated by cables of 333–666 feet; and a third amplifier series connected to said first and second amplifiers and cooperating therewith to compensate for video signals which have been attenuated by cable lengths of 666–1,000 feet; said selection means further including a first input pad associated with cable lengths of 0–333 feet; a second input pad associated with cable lengths of 333–666 feet; and a third input pad associated with cable lengths of 666–1,000 feet; and
    wherein said integrated circuit device further includes a multiplexer having inputs connected to said first, second and third input pads, said multiplexer being adapted to connect an output of the first, second or third amplifier to an input of the variable amplifier means as a function of selection signals applied to the first, second or third multiplexer input pads.

6. The circuit of claim 1 which further includes:
    a first pair of input pads for receiving video signals carried by a first cable;
    a second pair of input pads for receiving different video signals carried by a second cable; and
    means for selecting between the video signals on the first or second cable whereby the integrated circuit can be used to preamplify two different video input channels.

7. A preamplifier circuit for video signals, said circuit comprising:
an integrated circuit having a first set of video input pads for receiving a first video channel carried by a first cable; a second set of video input pads for receiving a second video channel carried by a second cable; variable amplifier means for amplifying video signals; a video output pad for coupling preamplified video signals to an external raster scan display; switch means for selectively connecting the first or second video channel to the variable amplifier means; and cable compensation means coupled between the input pads and variable amplifier means for selectively compensating for attenuation of the video signal due to various lengths of cable connected to the input pads, said compensation means including at least one amplifier and a compensation circuit for providing a predetermined gain to the at least one amplifier.

8. The preamplifier circuit of claim 7 wherein said cable compensation means comprises:
a first compensation amplifier for the first video channel, said first compensation amplifier compensating for attenuation of the signal on the first video channel by a cable having a length in a given range, the first compensation amplifier having an output;
a second compensation amplifier connected to the second set of input pads for compensating for signal attenuation on the second video channel by cables having lengths in said given range, said second compensation amplifier having an output;
a third compensation amplifier for compensating for signal attenuation by cables of lengths in a second range; and
whereby said switch means selectively connects the outputs of said first or second compensation amplifiers to an input of the third compensation amplifier.

9. The circuit of claim 8 which further comprises a fourth compensation amplifier for compensating for signal attenuation for cables of even longer length than the third compensation amplifier; and
multiplexer means for selectively connecting outputs of the first or second, third and fourth compensation amplifiers to the variable amplifier means depending upon the length of cable used to carry the first or second video channel signals.

10. The circuit of claim 9 wherein the third and fourth compensation amplifier circuits are connected together in series, with the first or second compensation amplifiers being connected in series with the input of the third compensation amplifier;
whereby the multiplexer means selectively connects outputs of the compensation amplifiers to the variable gain amplifier as a function of the length of the cable.

11. A preamplifier circuit for video signals, said circuit comprising:
a first input for receiving video signals carried by a first cable;
a second input for receiving video signals carried by a second cable;
first compensation amplifier means coupled to the first input and compensating for attenuation of signals carried by cables having lengths in a first range;
second compensation amplifier means coupled to the second input for compensating for signal attenuation by cables in said first range;
switch means for selecting signals on the first or second input;
a third compensation amplifier having an input connected in series with outputs of the first and second compensating amplifiers, said third compensating amplifier cooperating with the first or second compensating amplifier to compensate for cable lengths of a second range;
a fourth compensation amplifier having an input connected to an output of the third compensation amplifier, said fourth compensation amplifier compensating for cable lengths of a third range;
variable gain amplifier means for amplifying video signals applied to its input, said variable gain amplifier means having an output for connection to a raster scan display; and
multiplexer means for selectively connecting the output of the first or second, third and fourth compensation amplifiers to the input of the variable gain amplifier whereby video signals on either the first or second cable will be preamplified and the attenuation of the signal by the selected cable will be compensated by using the multiplexer to connect the appropriate output of the compensating amplifiers to the variable amplifier as a function of the length of the cable.

12. The circuit of claim 11 implemented in integrated circuit form.

* * * * *